(12) United States Patent
Blum et al.

(10) Patent No.: US 6,201,417 B1
(45) Date of Patent: Mar. 13, 2001

(54) SHAPING A CURRENT SENSE SIGNAL BY USING A CONTROLLED SLEW RATE

(75) Inventors: Gregory Allen Blum, West Warwick, RI (US); Gedaly Levin, Acton, MA (US)

(73) Assignee: Semiconductor Components Industries, LLC., Phoenix, AZ (US)

( * ) Notice: Subject to any disclaimer, the term of this patent is extended or adjusted under 35 U.S.C. 154(b) by 0 days.

(21) Appl. No.: 08/300,399

(22) Filed: Sep. 2, 1994

(51) Int. Cl.[7] .................................................... H03K 5/00
(52) U.S. Cl. ............................. 327/14; 327/34; 327/170; 327/551; 327/310
(58) Field of Search .............................. 327/14, 310, 311, 327/312, 336, 345, 379, 380, 551, 553, 558, 552, 561, 170, 58, 59

(56) References Cited

U.S. PATENT DOCUMENTS

| | | | |
|---|---|---|---|
| 4,443,844 | 4/1984 | Grace | 363/132 |
| 4,839,542 * | 6/1989 | Robinson | 327/558 |
| 4,859,881 * | 8/1989 | Yamamoto et al. | 327/311 |
| 4,912,393 | 3/1990 | Anderson et al. | 323/313 |
| 4,928,220 | 5/1990 | White | 363/56 |
| 4,947,171 | 8/1990 | Pfeifer et al. | 341/143 |
| 5,041,793 * | 8/1991 | Gailus | 330/2 |
| 5,191,269 * | 3/1993 | Carbolante | 318/254 |
| 5,192,884 * | 3/1993 | Kusano | 327/552 |
| 5,283,514 | 2/1994 | Hayward et al. | 323/280 |
| 5,285,148 | 2/1994 | Uhlenhoff et al. | 323/272 |
| 5,289,359 * | 2/1994 | Ziermann | 363/21 |
| 5,298,797 * | 3/1994 | Redl | 327/552 |
| 5,317,216 * | 5/1994 | Hosoya et al. | 327/555 |
| 5,382,838 * | 1/1995 | Sasaki et al. | 327/108 |

* cited by examiner

*Primary Examiner*—Timothy P Callahan
(74) *Attorney, Agent, or Firm*—Robert D. Atkins

(57) ABSTRACT

A method and circuit for reducing the leading edge spike in a current sense signal. The current sense signal is a measure of the current through a switched power device controlled by a switching regulator controller. The slew rate of the current sense signal is limited to prevent the slew rate from exceeding a predetermined maximum. The limited slew rate signal is provided to the switching regulator controller. A transconductance amplifier may be used to limit the slew rate of the current sense signal. A capacitor at the output of the transconductance amplifier contributes to controlling the maximum slew rate of the amplifier. The capacitor is charged by the current output of the amplifier to provide a voltage signal for use in place of the original current sense signal. A switch may be provided for selecting between the slew rate limited current sense signal and the original current sense signal. A time delay may be used to control the switch so that the slew rate limiting is replaced by the original current sense signal after a first predetermined time portion of each "on cycle" of the switched power device.

17 Claims, 4 Drawing Sheets

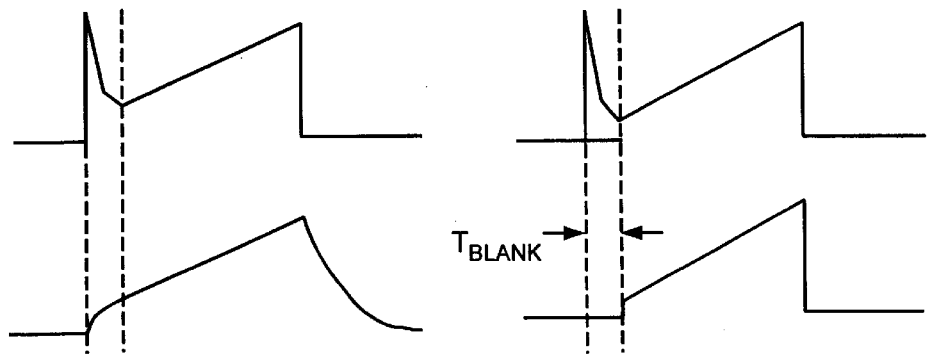
PRIOR ART
FIG. 1
PRIOR ART
FIG. 2
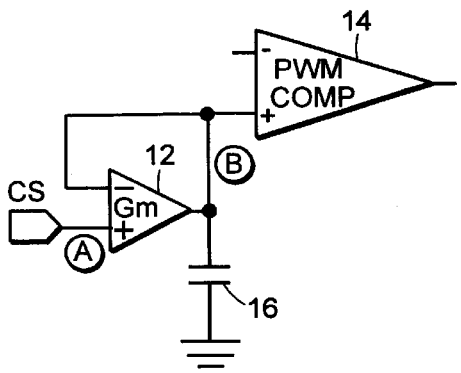
FIG. 3
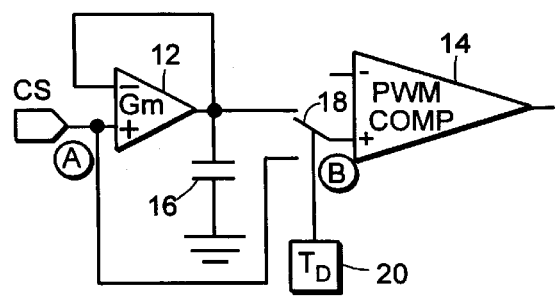
FIG. 5
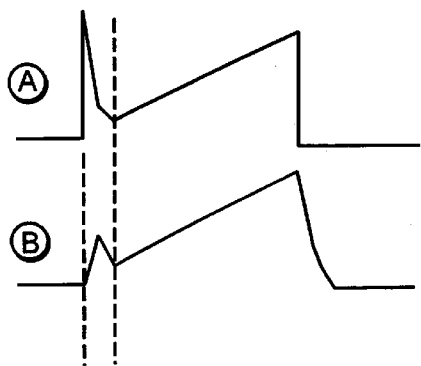
FIG. 4
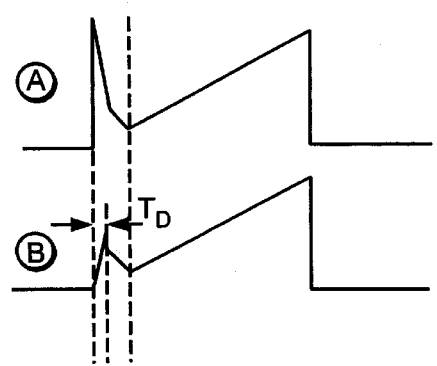
FIG. 6

SHAPING A CURRENT SENSE SIGNAL BY USING A CONTROLLED SLEW RATE

BACKGROUND OF THE INVENTION

The invention relates to switching regulator controller integrated circuits that rely upon sensing the current through switched power devices. In particular, the invention is directed to a circuit that reduces leading edge current spikes in a current sense signal that may occur during switching.

Switching regulator controllers operate by monitoring the amount of current flowing in a switching device such as a transistor driving a transformer. The current is typically monitored by adding a current sense element, such as a resistor or transformer, in series with the switching device. This element in effect transforms the current into a voltage signal which becomes an input to the switching regulator controller. When the level of the sensed input exceeds a set level, the output of the controller integrated circuit will change state. This state change will then disable the switching device which will cause the current in the device to cease.

The current waveform produced by a switching power device usually has a large leading edge spike due to the output rectifier reverse recovery time and transformer parasitics interaction. The current then increases linearly or almost linearly in time until the switching element is disabled. The current signal then decreases to zero.

In current mode control, the output voltage error signal is compared with the peak current. At the point of intersection between the error signal and peak current sensed in the power switch, the output is usually turned off. This way any change in input voltage, output voltage or output current conditions is reflected in the power switch's on time in such a way that the output voltage is kept relatively constant. This is called current mode controlled pulse width modulation (CMC PWM).

Because of the existence of the current spike described above, the sensed current waveform could exceed the error voltage prematurely. If this were to occur, the on time of the switched power device would terminate prematurely. This undesirable condition would cause the power supply to regulate improperly. One existing method for eliminating the leading edge current spike is to place a low pass RC filter between the current sense element and the current sense input of the PWM controller. A filter is formed from passive components that have an attenuation effect over the entire signal that is greater over certain frequency levels than others. As such a filter can insert some distortion into the entire signal, though its primary effect is directed at spike reduction. FIG. 1 shows a sense or current sense signal A with a leading edge spike. The waveform of the current sense signal A after it has been through an RC filter of the prior art is shown as waveform B.

A second method used to avoid the problems of a leading edge spike in a current sense signal is called leading edge blanking. A circuit disables the current sense input for a predetermined time at the beginning of each switching cycle. FIG. 2 illustrates a current sense signal A with a leading edge spike and the output B of a leading edge blanking circuit.

SUMMARY OF THE INVENTION

The present invention for reducing the leading edge current spike in a sense or current sense signal is directed to controlling the slew rate of the current sense signal to impose a maximum slew rate. The slew rate may also be referred to as the slope. The slew rate limited current sense signal is provided to a switching regulator controller. The slew rate limited signal may be switched off and replaced by the original current sense signal following a predetermined time delay after the switched power device is switched on.

An embodiment of the invention uses a transconductance amplifier as the controlled slew rate gain stage. A transconductance amplifier generates an output current that is proportional to an input voltage signal. A charging capacitor connected to the output of the transconductance amplifier converts the current output of the transconductance amplifier into a voltage slope limited signal for input into the switching regulator controller.

The present invention advantageously uses active components to control the slew rate of a current sense signal, preventing it from exceeding a predetermined maximum. When the current sense signal exceeds the maximum slew rate the active components produce a modification to the signal at the maximum slew rate. While the slew rate of the current sense signal is less than the predetermined maximum, the active components make no change to the shape of the current sense signal waveform.

Other objects and advantages of the present invention will become apparent during the following description of the presently preferred embodiments of the invention taken in conjunction with the drawings.

BRIEF DESCRIPTION OF THE DRAWINGS

FIG. 1 is a graphic illustration of a current sense signal waveform and a waveform modified by a low pass filter of the prior art.

FIG. 2 is a graphic illustration of a current sense signal waveform and a waveform of a leading edge blanked current sense signal produced in accordance with a prior art method.

FIG. 3 is a schematic representation of a first embodiment of the present invention.

FIG. 4 is a graphic illustration of a current sense signal and a modified current sense signal in accordance with the circuit of FIG. 3.

FIG. 5 is a schematic representation of a second embodiment of the present invention.

FIG. 6 is a graph of a current sense signal waveform and a modified current sense signal in accordance with the circuit of FIG. 5.

DETAILED DESCRIPTION OF THE PREFERRED EMBODIMENTS

Figure 7:
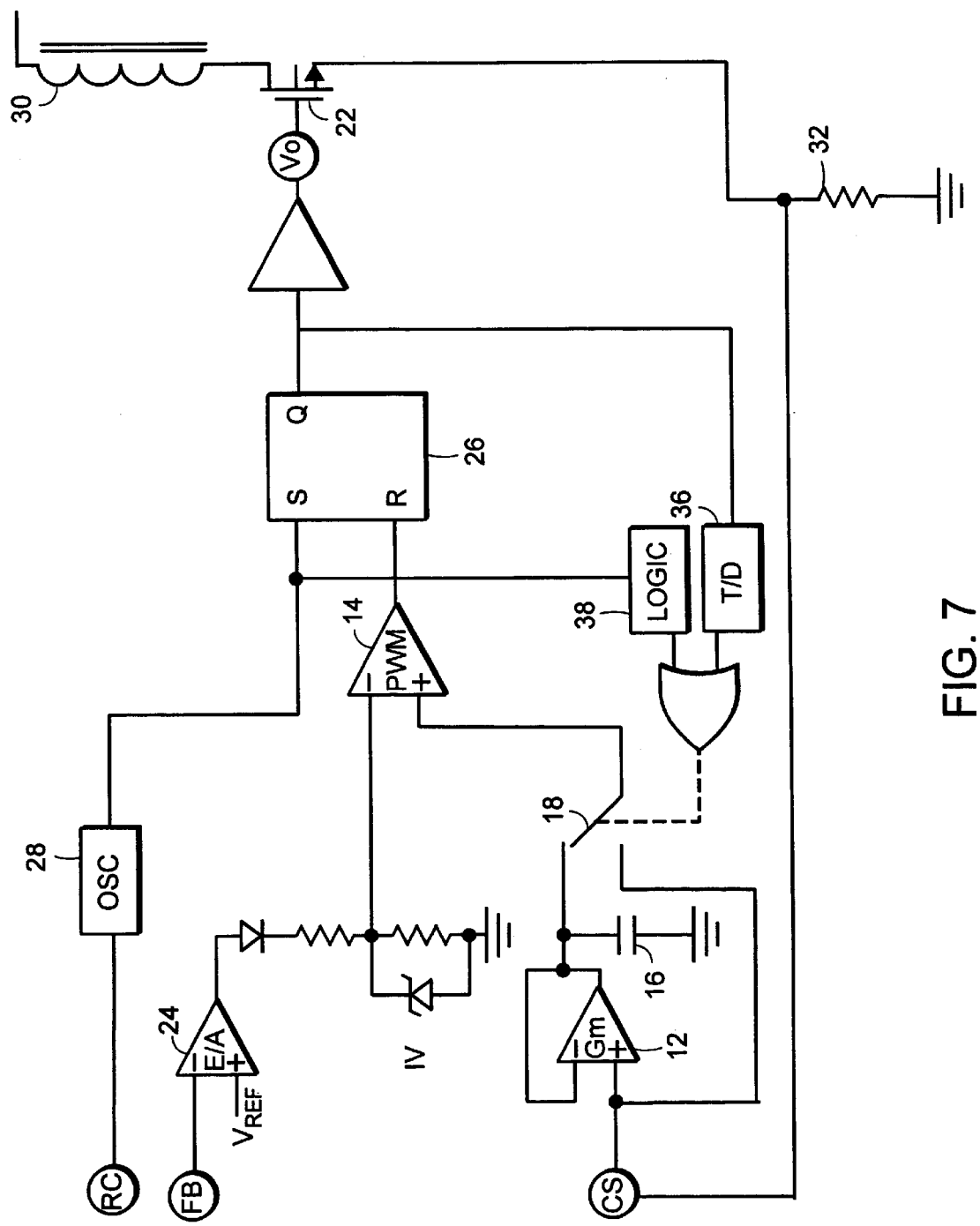
FIG. 7 is a schematic block diagram of a slew rate limiter of an embodiment of the invention implemented in a current mode controlled pulse width modulator.

In accordance with an embodiment of the invention, the slew rate of a sense or current sense signal is controlled by use of the circuit of FIG. 3. A current sense signal CS is produced in a conventional manner by a current sense element coupled to the output of a switched power device. A gain stage is inserted between the current sense signal and a current sense comparator 14 of a switching regulator controller. The gain stage may be a controlled slew rate amplifier having a maximum slew rate, such as transconductance amplifier, 12. Switching regulator controllers are also called switching converter controllers, or switching power supply controllers., A switching regulator controller may use any of a number of control methods including but not limited to pulse width modulation, frequency modulation or phase modulation. The transconductance amplifier 12 is arranged with its output feeding back into its inverting input. The non-inverting input of the transconductance amplifier 12 receives the current sense signal. The current sense signal typically has a meaningful voltage portion that is proportional to a current in a switched power device and may have an unwanted spike portion. Leading edge spike portions are commonly caused by output rectifier reverse recovery time and transformer parasitics. The transconductance amplifier converts the current sense signal into a current that is proportional to the voltage of the current sense signal with the exception that the transconductance amplifier implements a maximum slew rate on the signal.

The output of the transconductance amplifier 12 is applied to a capacitor 16. In the presently preferred embodiment, the other end of capacitor 16 is connected to ground. The maximum slew rate set by the transconductance amplifier should be set so that it is no less than the highest anticipated rising edge of the meaningful portion of the current sense signal under normal operating conditions. The current from the transconductance amplifier 12 charges the capacitor 16. The voltage on the capacitor 16 is applied as a voltage signal to the current sense comparator 14 of the switching regulator controller.

The waveforms in FIG. 4 provide an illustration of the slew rate limited current sense signal produced by the circuit of FIG. 3. Waveform A is a representative current sense signal with a leading edge spike. Waveform B shows the slew rate limit on the leading edge spike such that it will not prematurely trigger the current sense comparator 14. Once the effect of the leading edge spike is passed by, the slew rate limited current sense signal is the same shape as the current sense signal. Therefore, by limiting the slew rate of the current sense signal with a controlled slew rate, the current spike portion of the current sense signal is attenuated without attenuating or distorting the meaningful portion of the current sense signal.

In accordance with a second embodiment of the invention shown in FIG. 5, a switch 18 may be connected to the switching regulator controller. The switch 18 offers a choice between the original current sense signal and the slew rate limited current sense signal. The switch 18 determines which of these two signals is input into the current sense comparator 14. Since the slew rate limit is normally only required during the very first portion of each switching cycle, the switch 18 may be controlled by a time delay 20. The time delay is counted from when the switched power device is turned on. Depending upon the circuit application, the length of a time delay may be set accordingly. A presently preferred time delay is 70 nanoseconds. As shown in FIG. 6 during the initial time delay period, the input to the current sense comparator 14 is slew rate limited At the completion of the time delay, the signal switches to the current sense signal. Accommodation is made in the time delay 20 to discharge capacitor 16 before the next on cycle of the switched power device.

Slew rate limiting of a current sense signal in accordance with the invention may be used in a current mode controller circuit as shown in FIG. 7. In accordance with current mode control, a feedback signal proportional to the voltage output of a switched power device 22 is compared with a reference voltage in an error amplifier 24. The output of the error amplifier is input to another comparator, this time a current sense comparator or pulse width modulator 14. Conventionally, a current sense signal is compared with the output of the error amplifier in the PWM 14. In accordance with the invention, a controlled maximum slew rate is used to reduce the leading edge spike in the current sense signal. The output of the comparator 14 is directed into a PWM latch 26. In the illustrated implementation, the latch 26 is an SR flip-flop. The output of the PWM 14 is input into the R input of the flip-flop 26. An oscillator 28 provides the input into the S input of the PWM latch 26. The output of the PWM latch 26 turns the switched power device 22 on or off. In the illustrated implementation, the switched power device 22 is shown driving a transformer 30. A current sense resistor 32 is used to monitor the output current through the switched power device 22. A current sense signal is required to complete current mode control. The current sense resistor 32 produces a voltage signal proportional to the current produced by the switched power device 22 for use as the current sense signal.

In accordance with an embodiment of the invention, the current sense signal from the current sense resistor 32 is input to a transconductance amplifier 12. The output of the transconductance amplifier 12 is connected to a capacitor 16. A switch 18 selects between the slew rate limited current sense signal from the transconductance amplifier 12 and capacitor 16, and the original current sense signal. Logic circuitry may be used to control the operation of the witch 18. Switch 18 connects to the original current sense signal after a predetermined time delay following a signal to switch on the switched power device 22. The original current sense signal may also be switched through switch 18 when the feedback signal to the error amplifier is lower than a predetermined threshold value which happens during overcurrent or short circuit conditions. The time delay circuit 36 and the logic circuit 38 will be discussed in greater detail with respect to FIG. 9.

Figure 8:
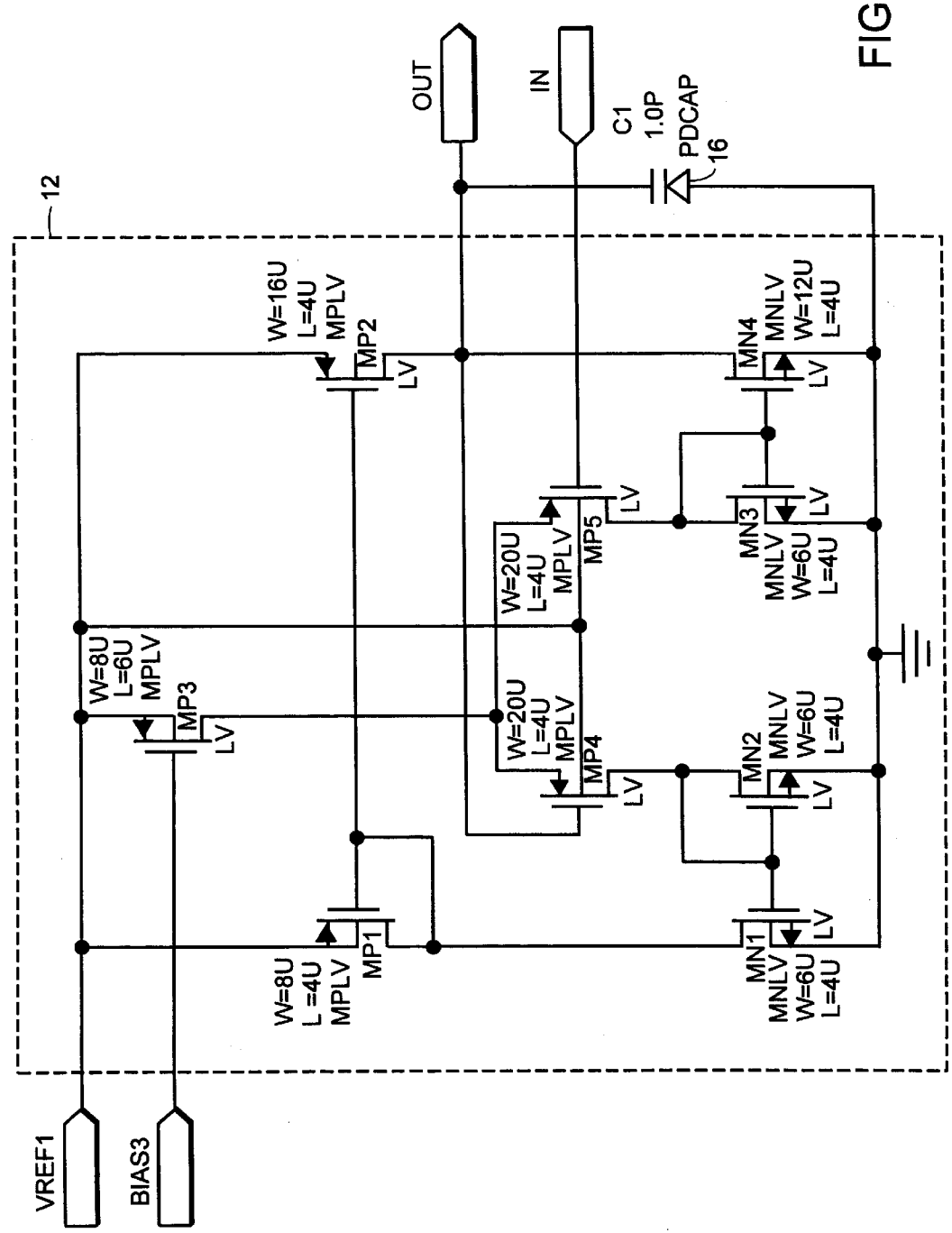
FIG. 8 is a schematic diagram of one embodiment of a transconductance amplifier for use in the circuit of FIG. 7.

Slew rate control is preferably performed in a circuit containing active components. Active components can be arranged to perform slew rate limiting when a predetermined maximum slew rate is exceeded and to not alter the information on the current sense signal when it is below the maximum slew rate. One embodiment of an arrangement of active components for controlling a slew rate to prevent it from exceeding a predetermined maximui is a transconductance amplifier as shown in FIG. 8. VREF1 is a constant voltage supply. A typical value for VREF1 is 5 volts. BIAS3 is a voltage that controls in conjunction with the capacitance of capacitor 16 the maximum slew rate permitted by the transconductance amplifier. The transconductance amplifier produces a current in proportion to an input voltage except when the controlled maximum slew rate is exceeded. Slew rate control may also be provided by an operational amplifier or other arrangements of active components to accomplish the slew rate limit objective.

Figure 9:
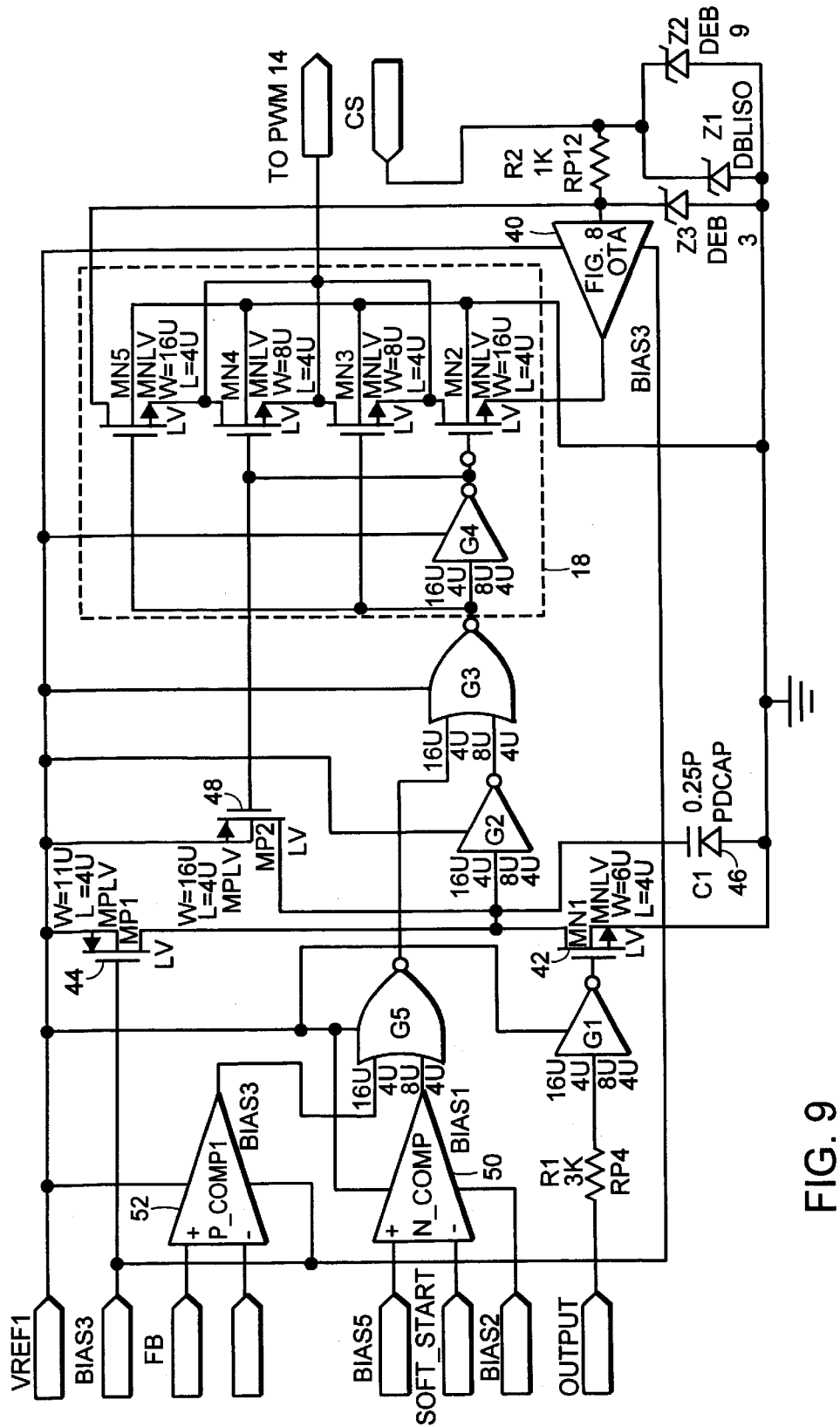
FIG. 9 is a schematic diagram of a time delay and logic control for a switch connected to a transconductance amplifier in accordance with an embodiment of the invention.

The control of switch 18 shall now be described in greater detail with respect to FIG. 9. The transconductance amplifier and capacitor 16 of FIG. 8 are represented by triangular block 40 in FIG. 9. When the power switching device 22 is switched on, the on signal (OUTPUT) from the switching regulator controller is used to turn off transistor switch 42. For a switching regulator controller such as the current mode control PWM of FIG. 7, the on signal may be provided by the PWM latch 26. With transistor switch 42 off, the time delay set by an FET 44 and a capacitor 46 begins. A constant current provided by FET 44 is allowed to flow onto capacitor 46. When capacitor 46 is charged up to a high signal level, switch 18 provides the original current sense signal to an input of the PWM comparator 14. Once the switch takes place, transistor 48 is turned on to quickly finish charging capacitor 46 to insure hysteresis. Transistor 48 makes sure that once the capacitor 46 indicates that the predetermined time period has elapsed that the switch is turned on hard to avoid a ringing situation. The values of the current from FET 44 and the value of capacitor 46 are selected to achieve the desired time delay.

Transistor switch 42 is switched on when the switched power device is disabled or switched off. Capacitor 46 is then discharged through transistor switch 42. The switch 18 reconnects the switching regulator controller to the slew rate controlled current sense signal. This remains connected until the power switched device turns on and the time delay transpires, at which time switch 18 reconnects the switching regulator controller to the original current sense signal.

Many current mode control circuits are provided with a soft start capability. A soft start is used when the control circuit is turned on. Soft start may be completed within the first 5 milliseconds of start up. Comparator 50 is used to identify when the supply voltage to the integrated circuit reaches 80% of its final full value. This is used to signal the completion of soft start. Once the soft start period has been completed, if the voltage feedback signal falls below a predetermined minimum level indicating that the power switched device is in a short circuit condition, switch 18 is caused to switch to the original current sense signal. Comparator 52 compares the voltage feedback signal with the predetermined minimum voltage reference. Logic gates are provided for achieving the desired result in controlling the switch 18. of course, it should be understood that various changes and modifications to the preferred embodiments described above will be apparent to those skilled in the art. For example, the slew rate limited current sense signal may be useful in reducing the leading edge spike in a number of switching regulator controllers both the current mode control PWM's and the voltage mode control PWM's. Other arrangements of active components such as op amps with a maximum slew rate to reduce the leading edge spike to an acceptable level may be substituted for the transconductance amplifier. These and other changes can be made without departing from the spirit and scope of the invention and without diminishing its attendant advantages. It is, therefore, intended that such changes and modifications be covered by the following claims.

We claim:

1. A circuit comprising:
   an amplifier having a controlled maximum slew rate, connected for receiving a current sense signal including a meaningful portion proportional to a current in a switched power device and a current spike portion and for generating an output, the maximum slew rate of said amplifier being set so as to attenuate the current spike portion without attenuating the meaningful portion of the current sense signal; and
   a switching regulator controller connected to receive the output of said amplifier and to control the switched power device.

2. The circuit of claim 1 wherein said amplifier comprises a transconductance amplifier and said circuit further comprises a charging capacitor connected to the output of said transconductance amplifier.

3. The circuit of claim 1 further comprising a switch connected to said switching regulator controller for selecting between directly receiving either the output of said amplifier or the current sense signal.

4. The circuit of claim 3 further comprising time delay means for causing said switch to change selection from the output of said amplifier to the current sense signal after a predetermined time delay after the switched power device is switched on by said switching regulator controller.

5. The circuit of claim 1 wherein said switching regulator controller comprises a current mode control pulse width modulator.

6. A method of current sensing comprising:
   controlling a switched power device with a switching regulator controller;
   producing a sense signal proportional to the current in the switched power device;
   applying a maximum slew rate limit to the sense signal to produce a slew rate limited sense signal having a slew rate that is prevented from exceeding the maximum slew rate limit; and
   providing the slew rate limited sense signal to the switching regulator controller.

7. The method of claim 6 further comprising:
   measuring a predetermined time delay following switching on the switched power device;
   switching off the slew rate limited sense signal to the switching regulator controller after the predetermined time delay and providing instead the sense signal to the switching regulator controller.

8. A circuit comprising:
   a gain stage connected to receive a current sense signal having a voltage proportional to a current in a switched power device, said gain stage generating an output current proportional to the voltage of the current sense signal unless a maximum output current is reached;
   a capacitor coupled to said gain stage so as to be charged by the output current, said capacitor charging at a maximum slew rate when the output of said gain stare is the maximum output current; and
   a switching regulator controller having an input connected to said capacitor and an output for controlling the switched power device.

9. The circuit of claim 8 further comprising a switch connected to said switching regulator controller for selecting between the voltage on said capacitor and the current sense signal.

10. The circuit of claim 9 further comprising a timer for measuring a predetermined time delay after the switched power device is switched on and means for causing said switch to change selection from the voltage on said capacitor to the current sense signal after the predetermined time delay.

11. The circuit of claim 8 wherein said gain comprises a transconductance amplifier.

12. The circuit of claim 8 wherein said switching regulator controller comprises a current mode control pulse width modulator.

13. A circuit comprising:
   means for receiving a current sense signal having a slew rate;
   active components, coupled to said receiving means, for producing a modified current sense signal, said active components being arranged to set the modified current sense signal at a predetermined maximum slew rate whenever the slew rate of the current sense signal exceeds the predetermined maximum slew rate, so as, to produce the modified current sense signal; and
   a switching regulator controller connected to receive the modified current sense signal and having an output for controlling a switched power device.

14. The circuit of claim 13 further comprising a switch connected to said switching regulator controller for selecting between the modified current sense signal and the current sense signal for input to said switching regulator controller.

15. The circuit of claim 14 further comprising time delay means for causing said switch to change selection from the modified current sense signal to the current sense signal for input to said switching regulator controller after a predetermined time delay following a signal to the output for said switching regulator controller switching on the switched power device.

16. The circuit of claim 13 wherein said switching regulator controller comprises a current mode control pulse width modulator.

17. The circuit of claim 16 wherein said active components are arranged into a transconductance amplifier.

* * * * *